United States Patent
Yamazaki et al.

(10) Patent No.: US 8,013,972 B2
(45) Date of Patent: *Sep. 6, 2011

(54) DISPLAY DEVICE AND METHOD OF FABRICATING THE SAME

(75) Inventors: Shunpei Yamazaki, Tokyo (JP); Yasuhiko Takemura, Kanagawa (JP); Setsuo Nakajima, Kanagawa (JP); Yasuyuki Arai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 85 days.

This patent is subject to a terminal disclaimer.

(21) Appl. No.: 12/264,641

(22) Filed: Nov. 4, 2008

(65) Prior Publication Data
US 2009/0185130 A1     Jul. 23, 2009

Related U.S. Application Data

(63) Continuation of application No. 11/776,683, filed on Jul. 12, 2007, now Pat. No. 7,446,843, and a continuation of application No. 10/968,953, filed on Oct. 21, 2004, now abandoned, and a continuation of application No. 10/300,226, filed on Nov. 19, 2002, now abandoned, and a continuation of application No. 09/517,354, filed on Mar. 2, 2000, now Pat. No. 7,050,138, and a continuation of application No. 09/062,873, filed on Apr. 20, 1998, now Pat. No. 6,118,502, and a continuation of application No. 08/611,336, filed on Mar. 8, 1996, now Pat. No. 5,757,456.

(30) Foreign Application Priority Data

Mar. 10, 1995 (JP) ............................... 7-079708
Mar. 16, 1995 (JP) ............................... 7-086457

(51) Int. Cl.
G02F 1/13        (2006.01)
(52) U.S. Cl. .................................... 349/187; 349/190
(58) Field of Classification Search ............ 349/187, 349/151.19
See application file for complete search history.

(56) References Cited

U.S. PATENT DOCUMENTS
3,892,471 A    7/1975  Biermann
(Continued)

FOREIGN PATENT DOCUMENTS
EP    0 545 694    6/1993
(Continued)

OTHER PUBLICATIONS

Bahadur pp. 171-181, Materials and Assembling Process of LCDs, 1990.

*Primary Examiner* — James A Dudek
(74) *Attorney, Agent, or Firm* — Fish & Richardson P.C.

(57) ABSTRACT

A method of fabricating a driver circuit for use with a passive matrix or active matrix electrooptical display device such as a liquid crystal display. The driver circuit occupies less space than heretofore. A circuit (stick crystal) having a length substantially equal to the length of one side of the matrix of the display device is used as the driver circuit. The circuit is bonded to one substrate of the display device, and then the terminals of the circuit are connected with the terminals of the display device. Subsequently, the substrate of the driver circuit is removed. This makes the configuration of the circuit much simpler than the configuration of the circuit heretofore required by the TAB method or COG method, because conducting lines are not laid in a complex manner. The driver circuit can be formed on a large-area substrate such as a glass substrate. The display device can be formed on a lightweight material having a high shock resistance such as a plastic substrate. Hence, a display device having excellent portability can be obtained.

15 Claims, 5 Drawing Sheets

U.S. PATENT DOCUMENTS

| | | |
|---|---|---|
| 4,094,058 A | 6/1978 | Yasutake |
| 4,310,380 A | 1/1982 | Flamm |
| 4,325,610 A | 4/1982 | Inoue |
| 4,409,268 A | 10/1983 | Inoue |
| 4,470,667 A | 9/1984 | Okubo |
| 4,482,213 A | 11/1984 | Piliavin |
| 4,643,526 A | 2/1987 | Watanabe |
| 4,691,995 A | 9/1987 | Yamazaki |
| 4,808,983 A | 2/1989 | Benjamin |
| 5,148,301 A | 9/1992 | Sawatsubashi |
| 5,187,604 A | 2/1993 | Taniguchi |
| 5,200,847 A | 4/1993 | Mawatari |
| 5,258,320 A | 11/1993 | Zavracky |
| 5,261,156 A | 11/1993 | Mase |
| 5,274,602 A | 12/1993 | Glenn |
| 5,317,236 A | 5/1994 | Zavracky |
| 5,317,433 A | 5/1994 | Miyawaki et al. |
| 5,339,180 A | 8/1994 | Katoh |
| 5,341,012 A | 8/1994 | Misawa |
| 5,376,561 A | 12/1994 | Vu |
| 5,426,526 A | 6/1995 | Yamamoto |
| 5,436,744 A | 7/1995 | Arledge |
| 5,499,124 A | 3/1996 | Vu |
| 5,569,610 A | 10/1996 | Zhang |
| 5,572,046 A | 11/1996 | Takemura |
| 5,576,231 A | 11/1996 | Konuma |
| 5,576,868 A | 11/1996 | Togashi |
| 5,576,869 A | 11/1996 | Yoshida |
| 5,596,023 A | 1/1997 | Tsubota |
| 5,614,733 A | 3/1997 | Zhang |
| 5,619,045 A | 4/1997 | Konuma |
| 5,633,182 A | 5/1997 | Miyawaki |
| 5,646,432 A | 7/1997 | Iwaki |
| 5,654,811 A | 8/1997 | Spitzer |
| 5,672,518 A | 9/1997 | Hayashi |
| 5,672,900 A | 9/1997 | Konuma |
| 5,701,167 A | 12/1997 | Yamazaki |
| 5,747,355 A | 5/1998 | Konuma |
| 5,757,456 A | 5/1998 | Yamazaki |
| 5,759,878 A | 6/1998 | Hayashi |
| 5,766,977 A | 6/1998 | Yamazaki |
| 5,781,164 A | 7/1998 | Jacobsen |
| 5,783,468 A | 7/1998 | Zhang |
| 5,786,242 A | 7/1998 | Takemura |
| 5,821,138 A | 10/1998 | Yamazaki |
| 5,834,327 A | 11/1998 | Yamazaki |
| 5,879,977 A | 3/1999 | Zhang |
| 6,143,582 A | 11/2000 | Vu |
| 6,153,893 A | 11/2000 | Inoue |
| 6,236,444 B1 | 5/2001 | Konuma |

FOREIGN PATENT DOCUMENTS

| | | |
|---|---|---|
| JP | 46-019008 | 5/1971 |
| JP | 47-18298 | 9/1972 |
| JP | 49-126350 | 12/1974 |
| JP | UM-B-50-15495 | 5/1975 |
| JP | 51-65656 | 6/1976 |
| JP | 53-91763 | 8/1978 |
| JP | UM-A-57-124827 | 8/1982 |
| JP | 59-57221 | 4/1984 |
| JP | 59-171925 | 9/1984 |
| JP | 59-195222 | 11/1984 |
| JP | 60-21028 | 2/1985 |
| JP | 60-75817 | 4/1985 |
| JP | 60-111221 | 6/1985 |
| JP | 60-126624 | 7/1985 |
| JP | 61-190313 | 8/1986 |
| JP | 03-78728 | 4/1991 |
| JP | 03-114226 | 5/1991 |
| JP | 04-133033 | 5/1992 |
| JP | 04-170520 | 6/1992 |
| JP | 04-178633 | 6/1992 |
| JP | 04-255268 | 9/1992 |
| JP | 04-275444 | 10/1992 |
| JP | 05-066413 | 3/1993 |
| JP | 05-127179 | 5/1993 |
| JP | 05-249496 | 9/1993 |
| JP | 05-257171 | 10/1993 |
| JP | 05-267667 | 10/1993 |
| JP | 05-281557 | 10/1993 |
| JP | 06-504139 | 5/1994 |
| JP | 06-244104 | 9/1994 |
| JP | 06-268022 | 9/1994 |
| JP | 06-281960 | 10/1994 |
| JP | 06-295940 | 10/1994 |
| JP | 06-310570 | 11/1994 |
| JP | 06-318701 | 11/1994 |
| JP | 06-338612 | 12/1994 |
| JP | 07-014880 | 1/1995 |
| JP | 08-250745 | 9/1996 |
| JP | 08-254686 | 10/1996 |
| JP | 04-178633 B2 | 11/2008 |
| WO | 81/02947 | 10/1981 |
| WO | 92/12453 | 7/1992 |

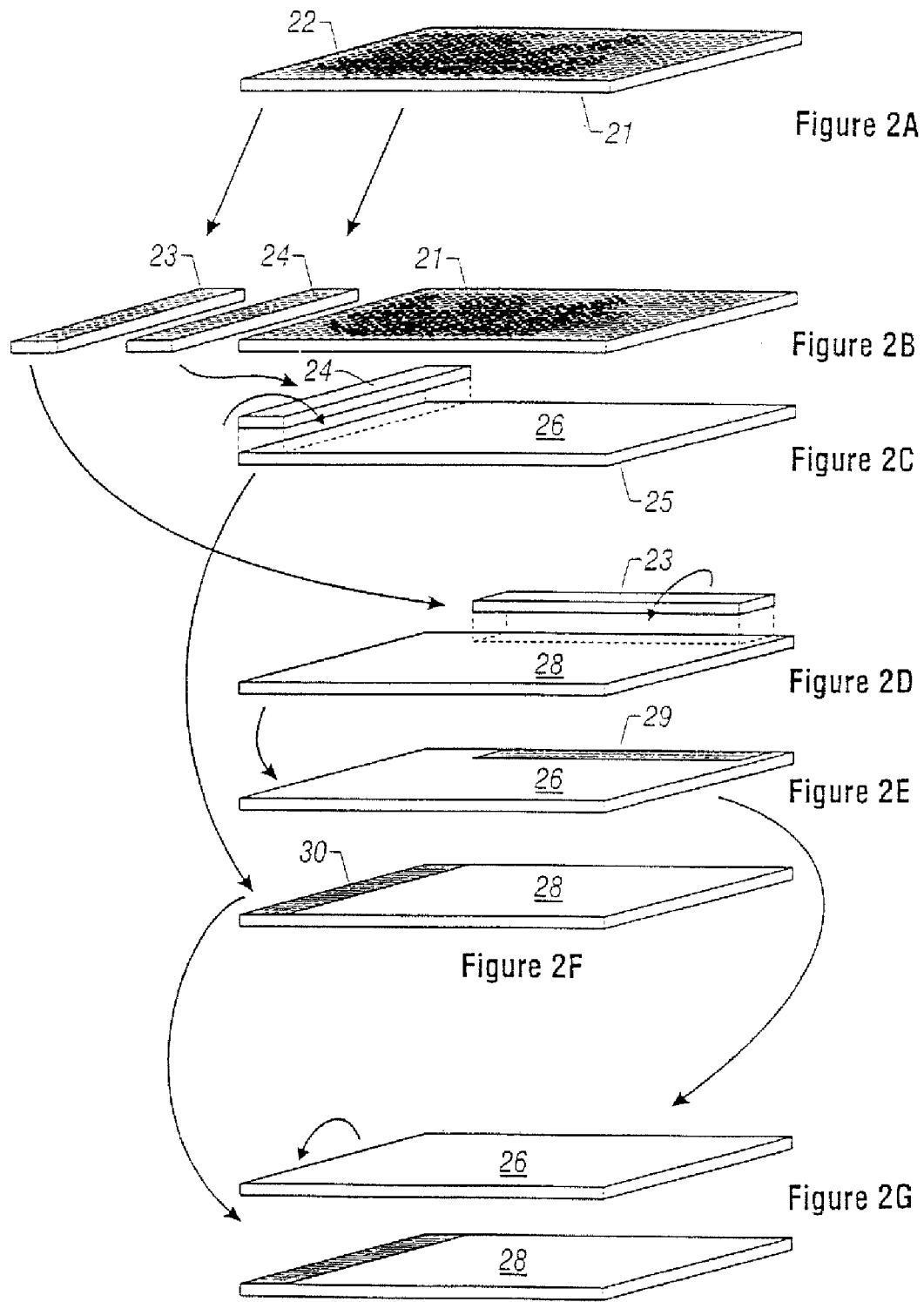

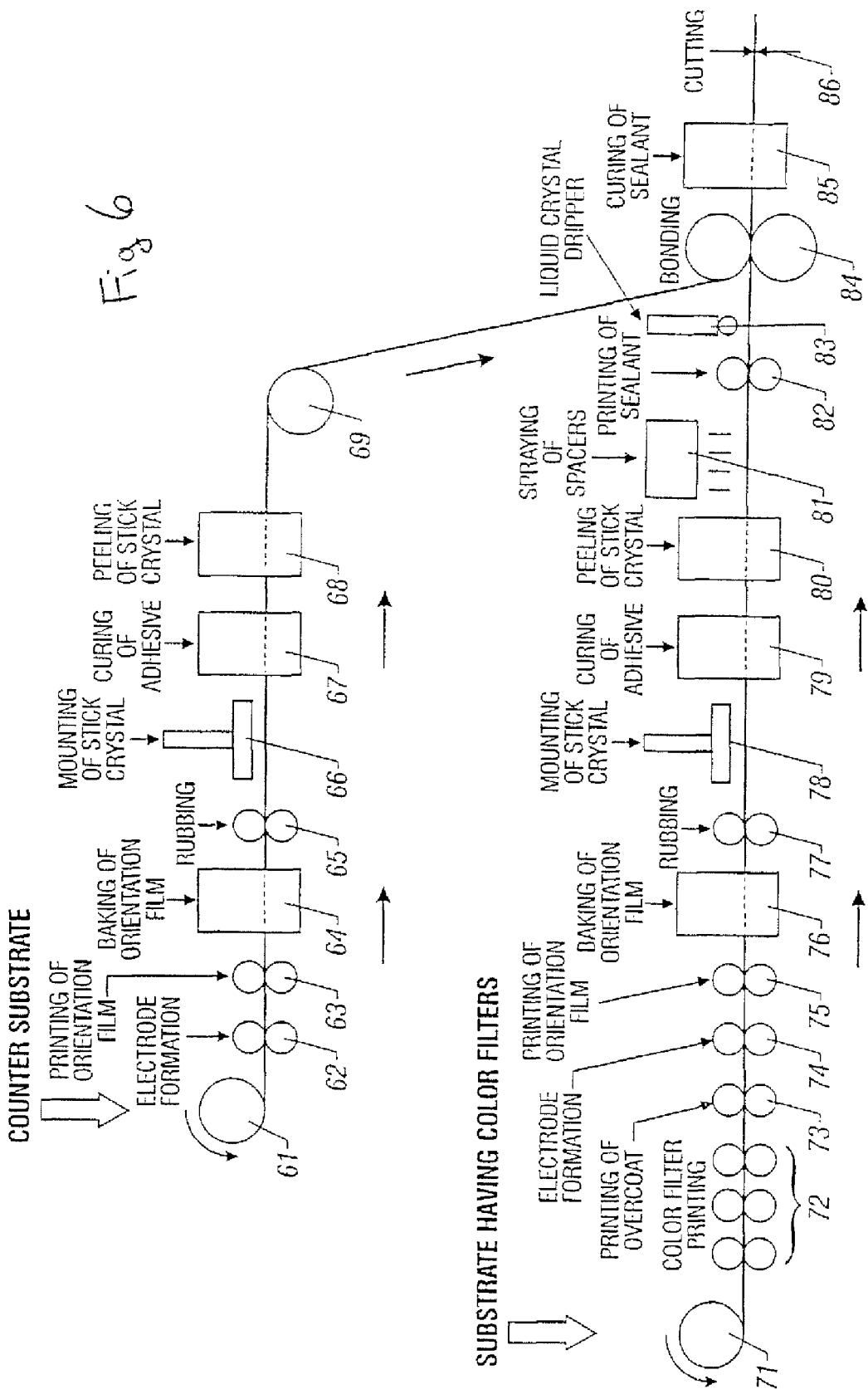

DISPLAY DEVICE AND METHOD OF FABRICATING THE SAME

CROSS-REFERENCE TO RELATED APPLICATIONS

This application is a continuation of U.S. application Ser. No. 11/776,683, filed Jul. 12, 2007, now allowed, which is a divisional of U.S. application Ser. No. 10/968,953, filed Oct. 21, 2004, which is a continuation of U.S. application Ser. No. 10/300,226, filed Nov. 19, 2002, which is a continuation of U.S. application Ser. No. 09/517,354, filed Mar. 2, 2000, now U.S. Pat. No. 7,050,138, which is a continuation of U.S. application Ser. No. 09/062,873, filed Apr. 20, 1998, now U.S. Pat. No. 6,118,502, which is a continuation of U.S. application Ser. No. 08/611,336, filed Mar. 8, 1996, now U.S. Pat. No. 5,757,456, which claims the benefit of foreign priority applications filed in Japan as Serial No. 7-86457 on Mar. 16, 1995 and Serial No. 7-79708 on Mar. 10, 1995, all of which are incorporated by reference.

BACKGROUND OF THE INVENTION

1. Field of the Invention

The present invention relates to a passive matrix or active matrix display such as a liquid crystal display and, more particularly, to a fashionable display device in which the ratio of the area of the display portion to the area of the substrates of the display device is increased by effectively mounting a driver semiconductor integrated circuit.

2. Description of the Related Art

Passive matrix type and active matrix type constructions are known as matrix display devices. In the passive matrix type, a number of stripe-shaped conducting lines (row lines) made of a transparent conductive film or the like are arrayed in a certain direction on a first substrate. On a second substrate, similar stripe-shaped conducting lines (column lines) are arrayed in a direction substantially perpendicular to the conducting lines on the first substrate. Both substrates are so arranged that the conducting lines on them intersect each other.

An electrooptical material such as a liquid crystal material whose transparency, reflectivity, or scattering performance is varied by a voltage, current, or the like is positioned between both substrates. If a voltage or current is applied between an addressed row line on the first substrate and an addressed column line on the second substrate, then the transparency, reflectivity, or scattering performance at the intersection can be set to a desired value. In this way, the display device can be matrix driven.

In the active matrix construction, row and column lines are formed on the first substrate by multilayer metallization techniques. Pixel electrodes are formed at the intersections of the row and column lines. An active device such as a thin-film transistor (TFT) is formed at each pixel electrode to control the potential or current in the pixel electrode. A transparent conductive film is also formed on the second substrate. Both substrates are so arranged that the pixel electrodes on the first substrate are located opposite to the transparent conductive film on the second substrate.

In either type, the substrates are selected according to the used process. For example, the passive matrix construction needs no complex process steps except for steps where the transparent conductive films are formed and etched into row and column conducting line patterns. The substrates of this passive matrix type may be made from plastic, as well as from glass. On the other hand, to manufacture the active matrix construction, a relatively high-temperature film formation step is required. Furthermore, the active matrix type must keep out mobile ions such as sodium ions. The substrates of the active matrix type must be made of glass containing a quite low concentration of alkali.

In any type of prior art matrix display device excluding special constructions, a semiconductor integrated circuit (peripheral driver circuit) for driving the matrix is required to be mounted. In the past, this has been done by tape automated bonding (TAB) or chip on glass (COG). However, the matrix construction contains as many as several hundreds of rows. Therefore, the integrated circuit has a very large number of terminals. The corresponding driver circuit takes the form of a rectangular IC package or semiconductor chip. To connect these terminals with the conducting lines on the substrates, it is necessary to lay the conducting lines in a complex manner. As a consequence, the ratio of the area of the peripheral portion, or non-display portion, to the area of the display portion is not negligibly small.

A method for solving this problem is disclosed in Japanese Patent Laid-Open No. 14880/1995, and consisting of forming a driver circuit on an elongated substrate (referred to as a stick or stick crystal) having a length substantially equal to one side of the matrix construction and connecting the driver circuit with the terminal portion of the matrix. This arrangement is permitted, because a width of about 2 mm suffices for the driver circuit. Therefore, almost the whole area of the substrate can be made a viewing screen.

Of course, in this case, where the matrix has a large area, it is impossible to form a circuit on a silicon wafer. Consequently, it is necessary to form the circuit on a glass substrate or the like. Hence, active devices used in semiconductor devices are TFTs.

However, where a stick crystal is employed, the thickness of the substrate of the driver circuit has been an obstacle to miniaturization of the whole display device. For example, where the display device should be made thinner, the thickness of the substrate is allowed to be set to 0.3 mm by optimising the kind of the substrate and the manufacturing steps. However, because of the strength necessary during manufacturing steps, it is difficult to reduce the thickness of the stick crystal below 0.5 mm. As a result, where two substrates are bonded together, the stick crystal protrudes as long as 0.2 mm or more.

Furthermore, if the stick crystal differs from the substrates of the display device in kind, then defects may be produced in the circuit because of the difference in coefficient of thermal expansion and for other causes. Especially, where a plastic substrate is used in a display device, this problem is conspicuous, because poor heat resistance of plastics makes it substantially impossible to use a plastic substrate as a stick crystal substrate.

Moreover, where the kind of the substrate supporting the stick crystal is different from the kind of the substrates of the display device, other known methods are used to circumvent the above-described problem. In one known method, a semiconductor integrated circuit having TFTs is fabricated on other support substrate. Then, the circuit is peeled off and adhesively bonded to another substrate. In another known method, the original support substrate is removed after adhesively bonding the circuit to another substrate. This technique is generally known as silicon-on-insulator (SOI) technique.

However, when the support substrate is removed, the semiconductor integrated circuit is often damaged, thus deteriorating the manufacturing yield.

SUMMARY OF THE INVENTION

It is an object of the present invention to provide a smaller display device of reduced weight by solving the foregoing problems with the stick crystal.

It is another object of the invention to provide a method of fabricating display devices with a high production yield by solving the aforementioned problems.

The present invention is characterized in that the driver circuit portion of a display device is made thinner by mechanically bonding a semiconductor integrated circuit equivalent to a stick crystal to a substrate for the display device, making electrical connections, and then removing only the substrate from the stick crystal. In this construction, stress induced by deformation caused by thermal expansion of the substrate is applied uniformly to the whole circuit. Therefore, the stress is prevented from being concentrated in certain portions; otherwise it would be inevitable that defects are produced.

Essentially, the present invention lies in a display device comprising a first substrate and a second substrate having a transparent conductive film on its surface. Conducting lines are formed on the first substrate. The first substrate has an elongated semiconductor integrated circuit which is electrically connected with the conducting lines and has TFTs. The transparent conductive film on the second substrate faces the surface of the first substrate on which the conducting lines are formed. The length of the semiconductor integrated circuit is roughly equal to the length of one side of the viewing surface, or the matrix, of the display device, in the same way as the stick crystal described in the above-cited Japanese Patent Laid-Open No. 14380/1995. The semiconductor integrated circuit is first fabricated on another substrate. The integrated circuit is peeled off and mounted on the first substrate.

In the case of the passive matrix type, the display device comprises a first substrate having an elongated first semiconductor circuit and a second substrate having a second semiconductor integrated circuit. A plurality of first conducting lines extending in a first direction are formed from a transparent conductive film on the first semiconductor integrated circuit. The first semiconductor integrated circuit is connected with the first conducting lines, has TFTs, and extends in a second direction substantially perpendicular to the first direction. The second substrate has second conducting lines which are formed from a transparent conductive film and extend in the second direction. The second semiconductor integrated circuit is connected with the second conducting lines, has TFTs, and extend in the first direction. The first and second substrates are so arranged that the first conducting lines are located opposite to the second conducting lines. The first and second semiconductor integrated circuits are obtained by fabricating them on other substrates, peeling the integrated circuits off, and bonding them to their respective substrates.

In the case of an active matrix type, the display device comprises a first substrate having a first and a second semiconductor integrated circuits and a second substrate having a transparent conductive film on its surface. A plurality of first conducting lines extending in a first direction are formed on the first substrate. The first semiconductor integrated circuit is connected with the first conducting lines, has TFTs, and extend in a second direction substantially perpendicular to the first direction. A plurality of second conducting lines extending in the second direction are formed also on the first substrate. The second semiconductor integrated circuit is connected with the second conducting lines, has TFTs, and extends in the first direction. The first and second substrates are so arranged that the first and second conducting lines on the first substrate are opposite to the transparent conductive film on the second substrate. The first and second semiconductor integrated circuits are obtained by fabricating them on other substrates, peeling the integrated circuits off, and mounting them to the first substrate.

The method consisting of forming a semiconductor integrated circuit having TFTs on other substrate, peeling off the circuit, and bonding the circuit to a further substrate (alternatively, the original substrate is removed after bonding to another substrate) is generally known as one of SOI (silicon-on-insulator) techniques and described in Japanese Patent Laid-Open No. 504139/1994. Also, other well-known techniques can be used.

The step for peeling a semiconductor integrated circuit from its support substrate needs the most advanced technique. The present invention is characterized in that when the semiconductor integrated circuit is peeled from the support substrate, a gas containing a halogen, especially halogen fluoride, is used.

A halogen fluoride is given by a chemical formula $XF_n$, where X is a halogen other than fluorine and n is an integer. It is known that halogen fluorides include chlorine mono fluoride (ClF), chlorine trifluoride ($ClF_3$), bromine monofluoride (BrF), bromine trifluoride ($BrF_3$), iodine monofluoride (IF), and iodine trifluoride ($IF_3$).

A halogen fluoride is characterized in that it etches silicon even under a non-plasma state but does not etch silicon oxide at all. Since it is not necessary to use a plasma, the circuit is not destroyed by plasma damage. This effectively contributes to an improvement in the production yield. Furthermore, the etching selectivity between silicon oxide and silicon is quite high. This is advantageous in that neither the circuit nor the elements are destroyed.

In the present invention, a peeling layer consisting principally of silicon is formed on a support substrate. A semiconductor integrated circuit coated with silicon oxide is formed on the peeling layer. As mentioned above, silicon is etched by a halogen fluoride without using a plasma. Other gases containing a halogen such as carbon tetrafluoride ($CF_4$) and nitrogen trifluoride ($NF_3$) etch silicon under a plasma condition and so they can be used for the invention.

Accordingly, by placing the support substrate either within a gas containing a halogen such as a halogen fluoride or within a plasma, the peeling layer is peeled from the support substrate. As a consequence, the semiconductor integrated circuit can be peeled off.

An example of a display device according to the present invention is shown in FIGS. 1(A)-1(D) in cross section. FIG. 1(A) depicts the device with a relatively small magnification. The left side of this figure shows a driver circuit portion 7 having a semiconductor integrated circuit 2. The right side shows a matrix portion 6. A conducting line pattern 4 is formed from a transparent conductive film on a substrate 1. A bump 6 is made of gold or other similar material. The semiconductor integrated circuit 2 has a thickness substantially equal to the thickness of TFTs. The integrated circuit 2 has a connector portion having an electrode 5 made of a conductive oxide whose contact resistance is not varied if it is oxidized. The electrode 5 is brought into contact with the bump 6. A resin 3 is injected between the semiconductor integrated circuit 2 and the substrate 1 to mechanically hold the components (FIG. 1(A)).

FIG. 1(B) is an enlarged view of the contact portion surrounded by the dotted line in FIG. 1(A). It is to be noted that like components are indicated by like reference numerals in various figures. FIG. 1(C) is an enlarged view of the portion surrounded by the dotted line in FIG. 1(B). The semiconductor integrated circuit includes an N-channel TFT 12 and a P-channel TFT 13 which are sandwiched by a buffer dielectric film 11 and an interlayer dielectric layer 14 and a passivation film 15 made of silicon nitride or the like (FIGS. 1(B) and 1(C)).

When a semiconductor integrated circuit is formed, the buffer film 11 is normally made of silicon oxide. However, sufficient moisture resistance cannot be obtained only with this scheme. Therefore, a passivation film must be formed on the buffer film. If the semiconductor circuit and its contact portion are thinner than the spacing between the substrates of the device as shown in FIG. 3, then it is possible to form, a counter substrate 16 on the circuit. In this case, the outer side of the driver circuit portion 7 is sealed with a sealing material 17 such as epoxy resin, in the same way as the manufacture of a liquid crystal device as disclosed in Japanese Patent Laid-Open No. 66413/1993. The gap between the substrates 1 and 16 is filled with a liquid crystal material 18 and so mobile ions do not intrude into the gap from the outside. Hence, any special passivation film is not required (FIG. 3).

The contact portion can use a bump as described above. Another method is illustrated in FIG. 1(D). That is, conductive particles 9 such as particles of gold are diffused into the contact portion to provide electrical contact. The diameter of the particles is slightly greater than the spacing between the semiconductor integrated circuit 2 and the substrate 1 (FIG. 1(D)).

The sequence for fabricating this display device which is of the passive matrix type is shown in FIGS. 2(A)-2(G). First, a number of semiconductor integrated circuits 22 are formed on an appropriate substrate 21 (FIG. 2(A)).

The resulting laminate is cut to form stick crystals 23 and 24. The electrical characteristics of the obtained stick crystals 23 and 24 may be checked before the next manufacturing step is effected, to judge whether the crystals are acceptable or rejected (FIG. 2(B)).

Then, the surfaces of the stick crystals 23 and 24 on which the circuits are formed are bonded to surfaces 26 and 28 of separate substrates 25 and 27, respectively. Conducting line patterns are formed from transparent conductive films on the surfaces 26 and 28. Electrical connections are made (FIGS. 2(C) and 2(D)).

Subsequently, the stick drivers 23 and 24 are peeled from, their respective substrates by SOI techniques or by processing with a gas containing a halogen. In this way, only semiconductor integrated circuits 29 and 30 are left on the surfaces 26 and 28, respectively, of the substrates (FIGS. 2(E) and 2(F)).

Finally, the laminates obtained in this manner are made to face each other. As a result, a passive matrix display is derived. A surface 26 faces away from the surface 26. That is, no conducting line pattern is formed on the surface 26 (FIG. 2(G)).

In the above example, the row stick crystal (i.e., the stick crystal for a driver circuit for driving row lines) and the column stick crystal (i.e., the stick crystal for a driver circuit for driving column lines) are extracted from the same substrate 21. Of course, they may be extracted from separate substrates.

The example shown in FIGS. 2(A)-2(G) is a passive matrix display. Obviously, the invention can be similarly applied to an active matrix display. In the illustrated examples given below, each substrate is made of a filmy material.

Other objects and features of the invention will appear in the course of the description thereof, which follows.

BRIEF DESCRIPTION OF THE DRAWINGS

FIGS. 2(A)-2(G) are exploded perspective views of another display device according to the invention, schematically illustrating a method of fabricating the device;

FIG. 6 is a schematic view of a system for fabricating filmy liquid crystal devices in succession.

DESCRIPTION OF THE PREFERRED EMBODIMENTS

EXAMPLE 1

Figure 4A:
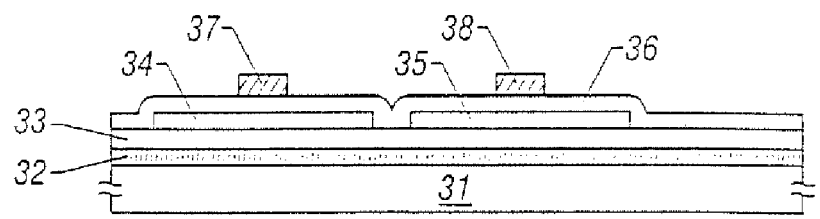
FIGS. 4(A)-4(C) are cross-sectional views of a stick crystal used for manufacturing steps according to the invention.
Figure 4B:
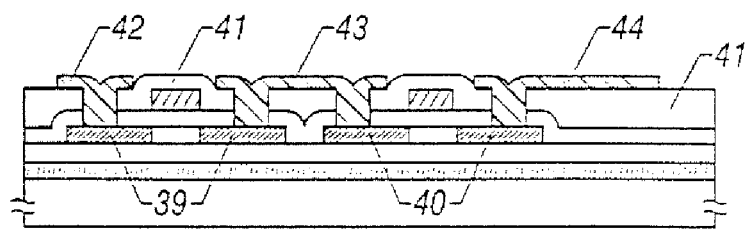
Figure 4C:
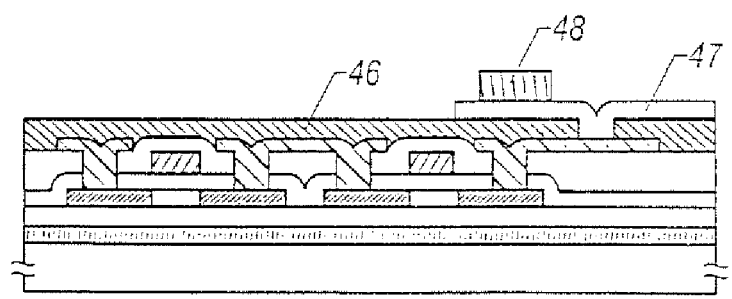

Manufacturing steps for fabricating one substrate of a passive matrix liquid crystal display are briefly described now. The present example is described by referring to FIGS. 4(A)-4(C) and 5(A)-5(D). Steps for forming a driver circuit on a stick crystal are schematically shown in FIGS. 4(A)-4(C). Steps for mounting the stick crystal on the substrate of the liquid crystal display are schematically shown in FIGS. 5(A)-5(D).

First, a silicon film having a thickness of 3000 Å was deposited as a peeling layer 32 on a glass substrate 31. Since the silicon film becoming the peeling layer 32 is etched away when circuitry and a substrate formed on the silicon film are separated, the quality of the silicon film will present almost no problems. Therefore, the silicon film may be deposited by a method which permits mass production. Furthermore, the silicon film may be either amorphous or crystalline in character.

The glass substrate may be made of Corning 7059 glass, Corning 1737 glass, NH Technoglass NA45, MH Technoglass MA35, Nippon Denki Glass OA2, other non-alkali or low-alkali glass, or quartz glass. Where quartz glass is used, the cost poses a problem. In the present invention, however, the area of the substrate used in one liquid crystal display is quite small and so the cost per device is sufficiently low.

A silicon oxide film was deposited as a buffer film 33 having a thickness of 5000 Å on the peeling layer 32. Sufficient care must be taken in fabricating the buffer film 33 from silicon oxide. Islands 34 and 35 of crystalline silicon region were formed by a well-known method. The thickness of the islands of crystalline silicon region greatly affects the required semiconductor characteristics. Generally, it was desired to make the thickness smaller. In the present example, the thickness was 400-600 Å.

Where crystalline silicon is obtained, laser annealing (i.e., amorphous silicon is illuminated with intense light such as laser light) or solid-phase epitaxy using thermal annealing is employed. Where solid-phase epitaxy is utilized, if a catalytic element such as nickel is added to the silicon as disclosed in Japanese Patent Laid-Open No. 244104/1994, then the crystallization temperature can be lowered, and the annealing time can be shortened. Furthermore, as described in Japanese Patent Laid-Open No. 318701/1994, once silicon is crystallized by solid-phase epitaxy, it may be laser-annealed. The adopted method is determined, taking account of the required semiconductor circuit characteristics, the maximum processing temperature of the substrate, and other factors.

Then, a gate-insulating film 35 of silicon oxide having a thickness of 1200 Å was deposited by plasma CVD or thermal CVD. Subsequently, gate electrodes/interconnects 37, 38 were formed from a crystalline silicon film having a thickness of 5000 Å. The gate electrodes/interconnects 37, 38 may be made from metals such as aluminum, tungsten, and titanium, or their silicides. Where metallic gate electrodes/interconnects 37, 38 are formed, their top or side surfaces may be coated with anodic oxide as disclosed in Japanese Patent Laid-Open Nos. 267667/1993 and 338612/1994. The material of the gate electrodes/interconnects 37, 38 is determined according to the required semiconductor circuit characteristics, the maximum processing temperature of the substrate, and other factors (FIG. 4(A)).

Thereafter, N- and P-type impurity ions were introduced into the islands of silicon 34 and 35 by self-aligned ion implantation or other method to form N-type regions 39 and P-type regions 40. Then, an interlayer dielectric film 41 of silicon oxide having a thickness of 5000 Å was deposited by a well-known means. Contact holes were created in this interlayer dielectric film. Aluminum alloy interconnects 41-44 were formed (FIG. 4(B)).

A silicon nitride film 46 having a thickness of 2000 Å was deposited as a passivation film on the laminate by plasma CVD. Contact holes communicating with the output terminal lines 44 were formed in this passivation film. An ITO (indium-tin oxide) electrode 47 having a thickness of 1000 Å was formed by sputtering techniques. ITO is a transparent conductive oxide. A gold bump 48 having a diameter of about 50 μm and a height of 30 μm was mechanically formed on the ITO electrode 47. The resulting circuit was cut into appropriate site, thus obtaining a stick crystal (FIG. 4(C)).

An electrode 50 was formed also from ITO to a thickness of 1000 Å on another substrate 49 of the liquid crystal display. In the present example, a substrate of polyethylene sulfite having a thickness of 0.3 mm was used. The substrate 31 of the stick driver was bonded to this substrate 49 under pressure. At this time, the electrodes 47 and 50 were electrically connected to each other via the bump 48 (FIG. 5(A)).

Then, an adhesive 51 to which a thermosetting organic resin was added was injected into the gap between the stick crystal 31 and the substrate 49 of the liquid crystal display. The adhesive may be applied to the surface of any one of the stick crystal 31 and the substrate 49 before they are bonded together under pressure.

The laminate was processed for 15 minutes in an oven filled with a nitrogen ambient at 120° C. In this way, electrical connection and mechanical bonding between the stick crystal 31 and the substrate 49 were completed. Before the bonding operation is completed in this way, a check may be done to see whether the electrical connection is satisfactory or not by the method disclosed in the above-cited Japanese Patent Laid-Open No. 14880/1995 (FIG. 5(B)).

The laminate processed in this way was allowed to stand in a scream of mixture gas of chlorine trifluoride ($ClF_3$) and nitrogen. The flow rate of each of the chlorine trifluoride and nitrogen was 500 SCCM. The reaction pressure was 1 to 10 torr. The temperature was room temperature. It is known that halogenated fluorine such as chlorine trifluoride selectively etches silicon. On the other hand, oxides such as silicon oxide and ITO are hardly etched. Also with respect to aluminum, if a stable oxide coating is formed on an aluminum film, then reaction no longer progresses. Hence, the aluminum is not etched.

Figure 5A:
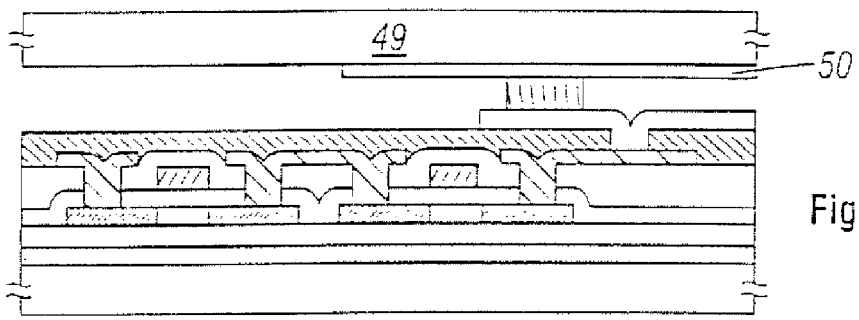
FIGS. 5(A)-5(D) are cross-sectional views, illustrating steps for bonding a stick crystal to a substrate.
Figure 5B:
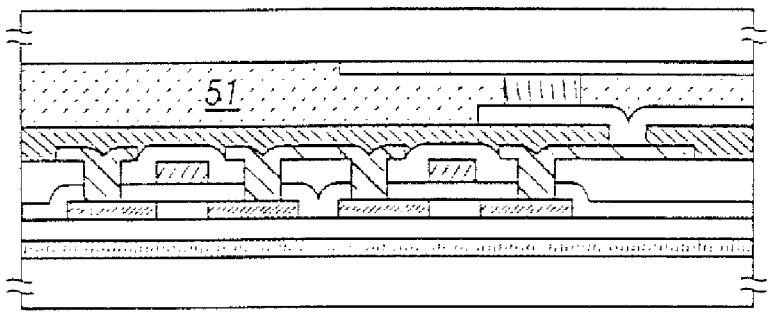
Figure 5C:
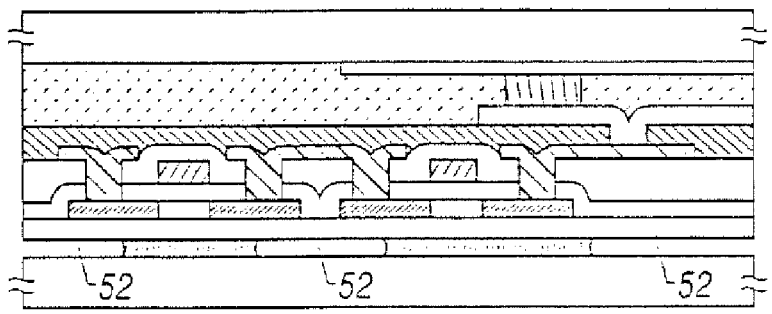
Figure 5D:
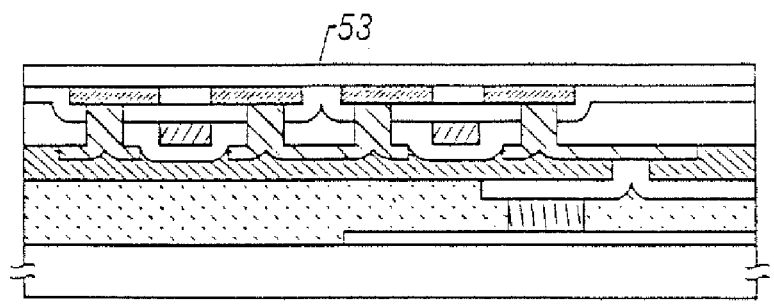

In the present example, materials which might be attacked by chlorine trifluoride are the peeling layer (silicon) 32, the islands of silicon 34, 35, the gate electrodes/interconnects 37, 38, the aluminum alloy interconnects 41-44, and the adhesive 51. These materials excluding the peeling layer 32 and the adhesive 51 are capped with silicon oxide and other materials and, therefore, chlorine trifluoride is unable to reach them. In practice, only the peeling layer 32 was selectively etched as shown in FIG. 5(C), thus forming voids 52.

As time passed further, the peeling layer 32 was completely etched away, so that the bottom surface 53 of the buffer film 33 was exposed. Thus, the substrate 31 of the stick crystal was separated from the semiconductor circuit. With etching using chlorine trifluoride, the etching process came to a stop at the bottom surface of the buffer film and so the bottom surface 53 was quite flat (FIG. 5(D)).

In this manner, fabrication of the semiconductor integrated circuit on one substrate of the liquid crystal display was completed. The liquid crystal display is completed, using the substrate obtained in this way.

EXAMPLE 2

The present example relates to a method (referred to as the roll-to-roll method) of successively fabricating; filmy passive matrix liquid crystal displays. A production system, for implementing the present example is shown in FIG. 6. The substrate material for obtaining the filmy liquid crystal displays may be selected from polyethylene sulfite, poly-carbonate, and polyimide. Since polyethylene terephthalate and polyethylene naphthalate are polycrystalline plastics, they are not appropriate as liquid crystal materials which provide displays making use of polarization of light.

The production system shown in FIG. 6 is divided into two major parts: the upper portion and the lower portion. In the lower portion, a substrate on which color filters are formed is fabricated as a component of a liquid crystal display. In the upper portion, a counter substrate is manufactured. First, steps for fabricating the substrate on which the color filters are formed are described.

Color filters of the three primary colors (RGB) are printed on the surface of a film wound on a roll 71. The color filters are formed, using three sets of rolls 72. Where the manufactured liquid crystal displays are monochrome devices, this step is dispensed with. This step is referred to as color filter printing.

Then, an overcoat is printed to form a planarization film, using rolls 73. The overcoat acts to planarize the surface which is made uneven by the formation of the color filters. A transparent resinous material may be used as the material of the overcoat. This step is referred to as printing of overcoat (planarization film).

Then, row (column) electrodes are printed in a desired pattern, using a conductive ink, by means of rolls 74. This step is referred to as formation of electrodes.

Thereafter, an orientation film is printed, using roils 75. This step is referred to as printing of orientation film. The film is passed through a heating furnace 76 to bake and solidify the orientation film. This step is referred to as the baking of orientation film.

The film is then passed between rolls 77 to rub the surface of the orientation film. In this way, the orientation step is completed. This step is referred to as rubbing.

Then, a stick crystal is mounted on the substrate by a pressure connection device 78. This step is referred to as mounting of the stick crystal. The laminate is passed through a heating furnace 79 to cure the adhesive. Thus, the bonding operation is completed. This step is referred to as curing of the adhesive.

In the present example, the peeling layer uses silicon, in the same way as in Example 1. Then, the peeling layer is etched by a chlorine trifluoride chamber 80 which is differentially pumped to prevent the chlorine trifluoride from leaking out. As a result, the substrate is peeled from the stick crystal. This step is referred to as peeling of the stick crystal.

Figure 1A:
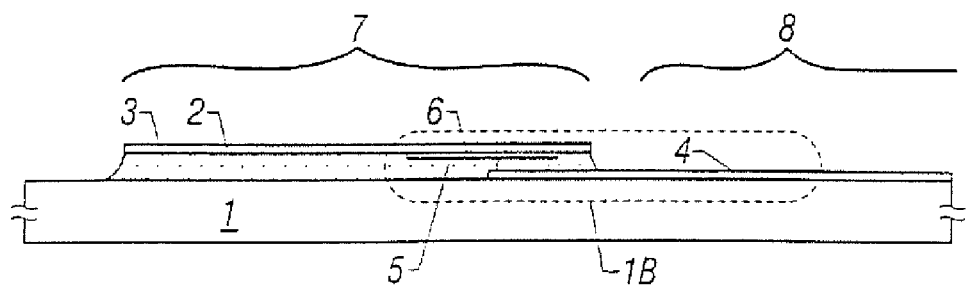
FIGS. 1(A)-1(D) are cross-sectional views of a display device according to the present invention.
Figure 1B:
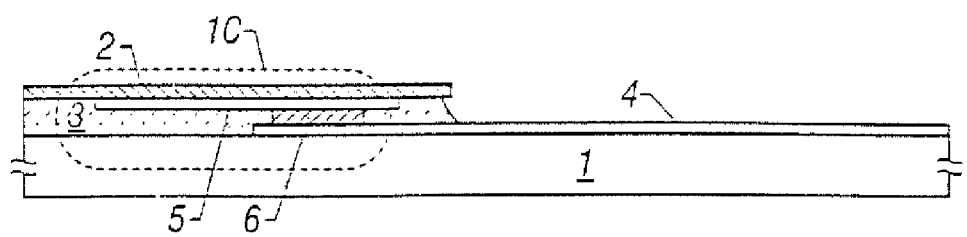
Figure 1C:
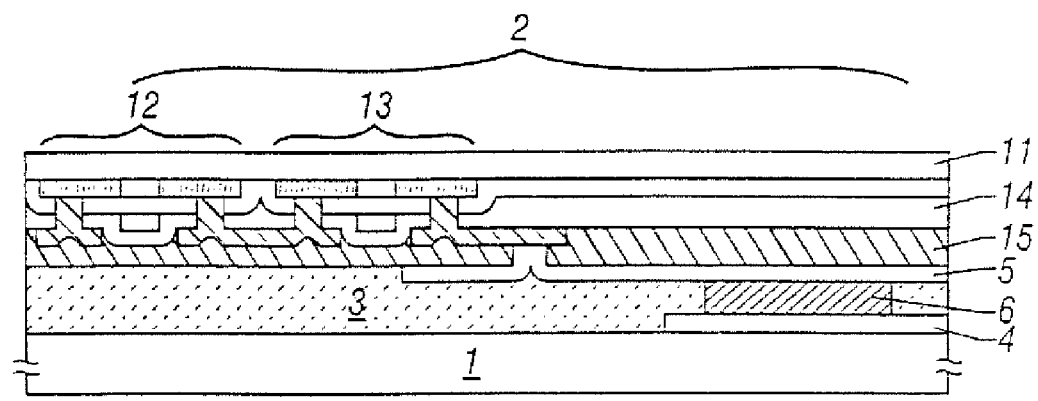
Figure 1D:
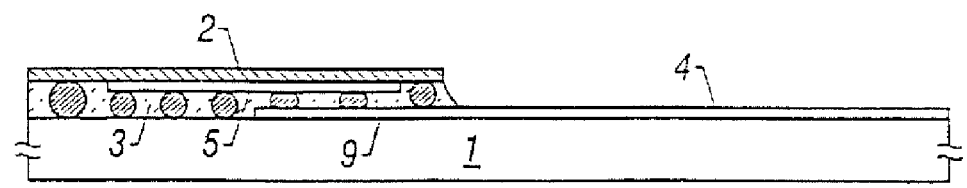
Figure 3:
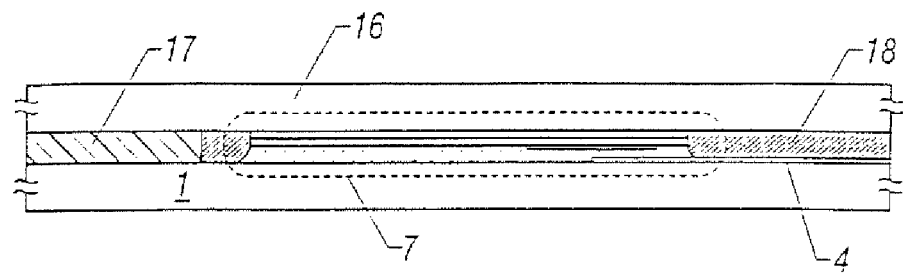
FIG. 3 is a cross-sectional view of a further display device according to the invention.

Then, spacers are sprayed onto the filmy substrate by a spacer applicator 81. This step is referred to as spraying of spacers. A sealing material is printed, using rolls 82. The sealing material acts to bond together the two opposite substrates and to prevent the liquid crystal material from leaking from the space between the substrates. In the present example, the semiconductor circuit is rendered thinner than the spacing between the substrates to seal the outer surface of the semiconductor integrated circuit as shown in FIG. 3, as disclosed in the above-cited Japanese Patent Laid-Open No. 66413/1933. This step is referred to as printing of the sealant.

Subsequently, a liquid crystal material is dripped, using a liquid crystal dripper 83. As a result, a liquid crystal material layer is formed on the filmy substrate. In this way, the substrate on the side of the color filters, or a color filter panel, is completed. These manufacturing steps are made to progress successively by rotating the various rolls.

Then, steps for manufacturing the counter substrate are described. Column (row) electrodes are formed in a desired pattern on the filmy substrate fed out of a roll 61 by means of rolls 62. This step is referred to as formation of electrodes.

Thereafter, an orientation film is formed by printing techniques, using rolls 63. This step is referred to as printing of the orientation film. The film is passed through a heating furnace 64 to bake and solidify the orientation film. This step is referred to as baking of the orientation film.

Then, the filmy substrate is passed between rolls 65 to orient the molecules of the liquid crystal material. This step is referred to as rubbing.

The stick crystal is mounted on the substrate by a pressure connection device 66. This step is referred to as mounting of the stick crystal. The laminate is passed through a heating furnace 67 to cure the adhesive. This step is referred to as curing of the adhesive.

Then, the substrate of the stick crystal is peeled off by a chlorine trifluoride chamber 63. This step is referred to as peeling of the stick crystal.

The filmy substrate undergone the steps described thus far is passed around a roll 69 and sent to next rolls 84. The substrate having the color filters and the counter substrate are bonded together by the rolls 84, thus forming a liquid crystal cell. This step is referred to as bonding.

The assembly is then heated by a heating furnace 85 to cure the sealing material. In this way, the bonding of the substrates is completed. This step is referred to as curing of the sealant.

The assembly is cut into desired dimensions by a cutter 86, thus completing a filmy liquid crystal display. This step is referred to as cutting.

In the present invention, the kinds, the thickness, and the size of the substrates of the display device can be varied variously. For example, as described in Example 2, a liquid crystal display in the form of a quite thin film can be obtained. In this case, the display device may be curved along a curved surface and bonded to it. Furthermore, less restrictions are imposed on the kind of the substrates. As a consequence, a lightweight material having high shock resistance such as a plastic substrate may also be used. This improves the portability.

In addition, in the present invention, the semiconductor integrated circuit forming a driver circuit is peeled from its support substrate by a halogen-containing gas which is not in a plasma state. Therefore, destruction of the semiconductor integrated circuit which would normally be caused by plasma damage can be prevented. This leads to an improvement in the yield with which liquid crystal displays are manufactured.

Moreover, the driver circuit occupies less area and so the display device can be arranged relative to other devices with a greater degree of freedom. Typically, the driver circuit can be confined within a region only a few centimeters wide around the display surface. Therefore, the display device itself is quite simple and is a highly fashionable industrial product. It can find extensive application. Hence, the present invention is industrially quite advantageous.

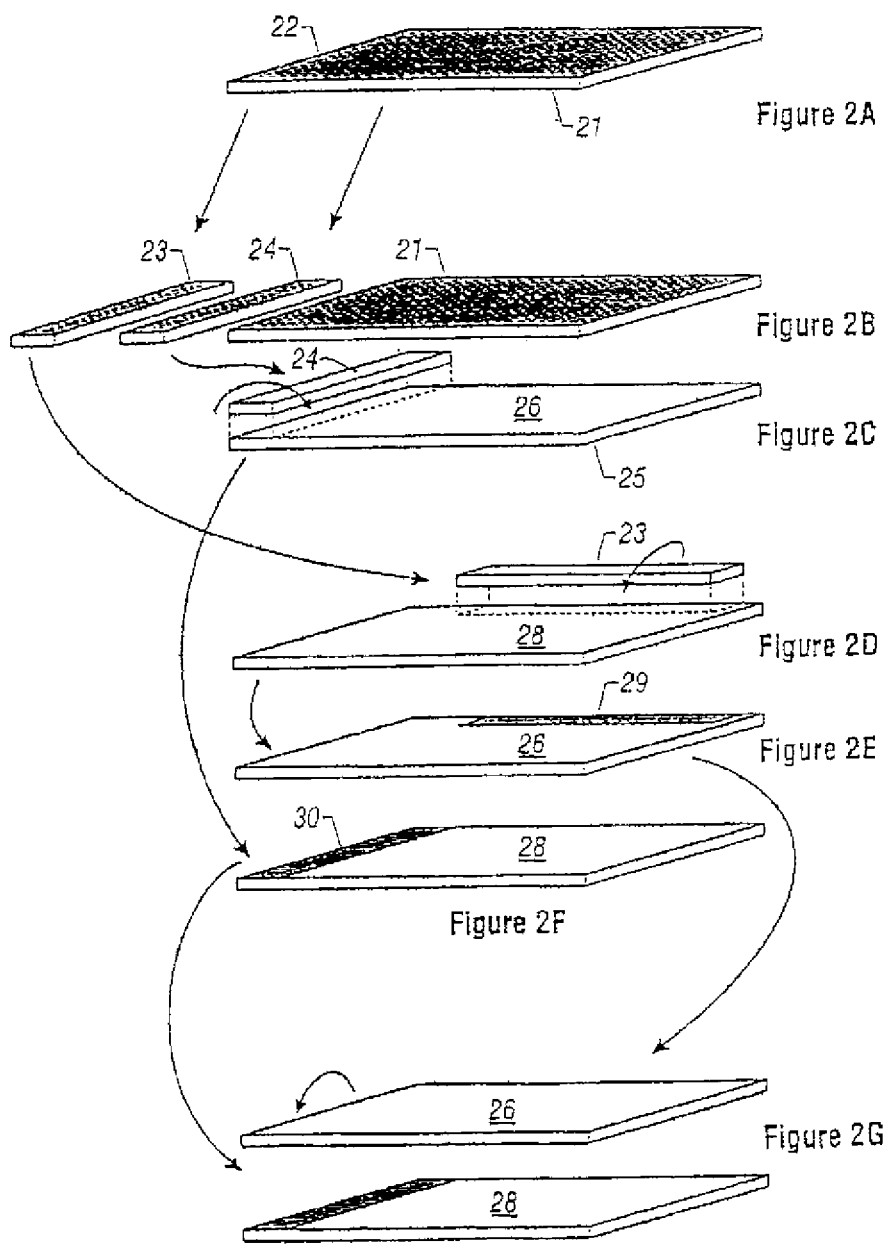

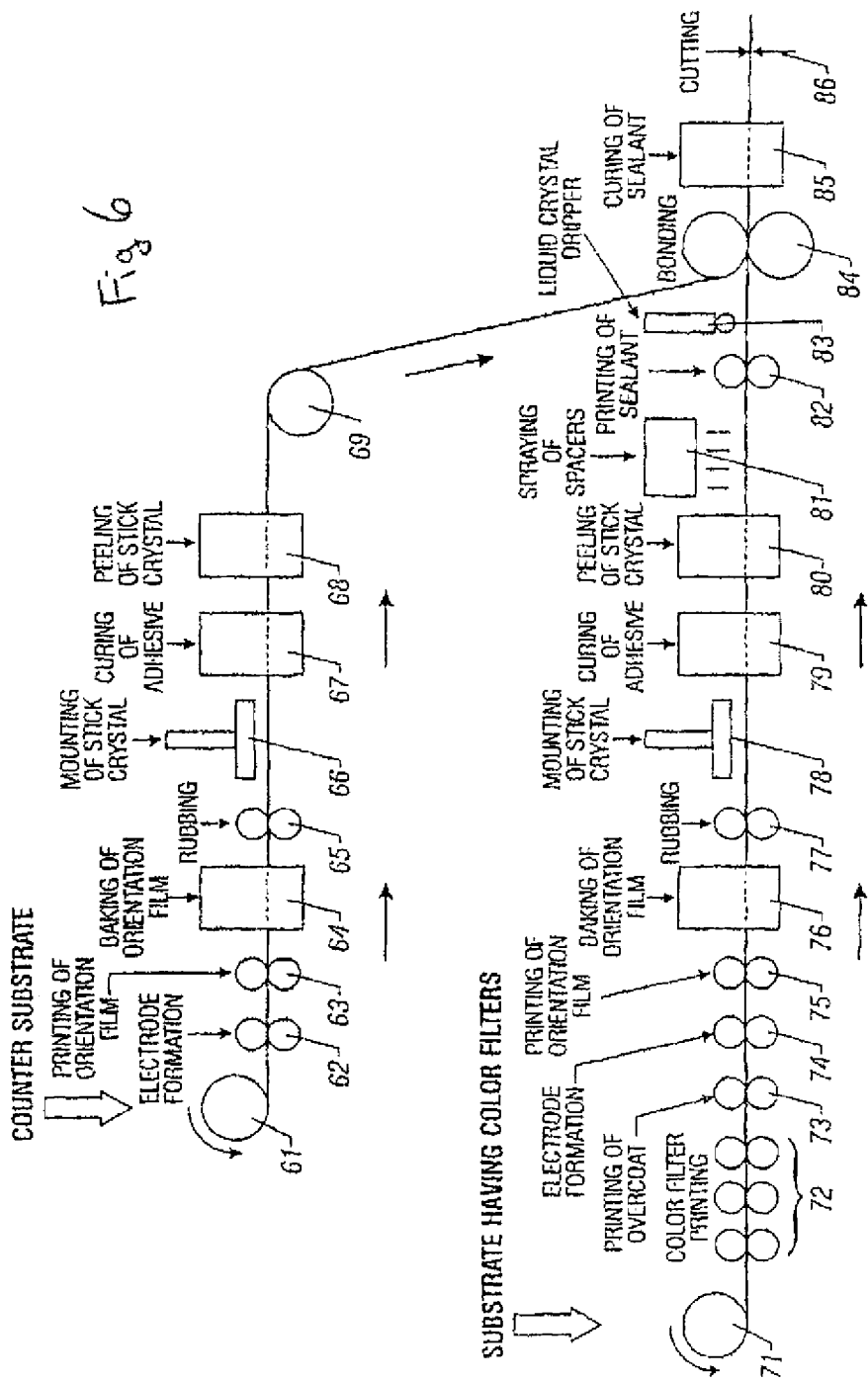

What is claimed is:

1. A method of manufacturing a display device comprising:
    forming a color filter over a first substrate;
    forming a planarization film over the color filter by printing;
    forming an electrode over the planarization film;
    forming an orientation film over the electrode;
    providing a driver circuit over the first substrate with an adhesive therebetween, said driver circuit held by a second substrate;
    removing said second substrate to leave said driver circuit over the first substrate;
    forming a sealing material over the first substrate;
    dripping a liquid crystal material onto the orientation film;
    bonding a counter substrate to the first substrate with said liquid crystal material interposed therebetween by said sealing material; and
    cutting the bonded first and counter substrates.

2. The method according to claim 1 wherein the driver circuit comprises a thin film transistor.

3. The method according to claim 1 wherein said display device is a passive type display device.

4. The method according to claim 1 wherein said display device is an active matrix display device.

5. The method according to claim 1 wherein the first substrate is a flexible substrate.

6. A method of manufacturing a display device comprising:
    forming an electrode over a first flexible substrate;
    providing a driver circuit over the first flexible substrate with an adhesive therebetween, said driver circuit held by a second substrate;
    removing said second substrate to leave said driver circuit over the first flexible substrate;
    forming a sealing material over the first flexible substrate;
    bonding a counter flexible substrate to the first flexible substrate by said sealing material; and
    cutting the bonded first and counter flexible substrates.

7. The method according to claim 6 further comprising dripping a liquid crystal material over the first flexible substrate.

8. The method according to claim 6 wherein the driver circuit comprises a thin film transistor.

9. The method according to claim 6 wherein said display device is a passive type display device.

10. The method according to claim 6 wherein said display device is an active matrix display device.

11. A method of manufacturing a display device comprising:
    forming a color filter over a first flexible substrate;
    forming a planarization film over the color filter;
    forming an electrode over the planarization film;
    providing a driver circuit over the first flexible substrate with an adhesive therebetween, said driver circuit held by a second substrate;
    removing said second substrate to leave said driver circuit over the first flexible substrate;
    forming a sealing material over the first flexible substrate wherein the driver circuit is located in a region surrounded by the sealing material;
    bonding a counter flexible substrate to the first flexible substrate by said sealing material; and cutting the bonded first and counter flexible substrates, wherein the driver circuit is located between the first and counter flexible substrates.

12. The method according to claim 11 further comprising dripping a liquid crystal material over the first flexible substrate.

13. The method according to claim 11 wherein the driver circuit comprises a thin film transistor.

14. The method according to claim 11 wherein said display device is a passive type display device.

15. The method according to claim 11 wherein said display device is an active matrix display device.

* * * * *

UNITED STATES PATENT AND TRADEMARK OFFICE
CERTIFICATE OF CORRECTION

| | |
|---|---|
| PATENT NO. | : 8,013,972 B2 |
| APPLICATION NO. | : 12/264641 |
| DATED | : September 6, 2011 |
| INVENTOR(S) | : Shunpei Yamazaki |

It is certified that error appears in the above-identified patent and that said Letters Patent is hereby corrected as shown below:

In the Drawings

Replace "Sheet 2 of 5, Figures 2A-2F" (figures tilted) with attached replacement "Sheet 2 of 5, Figures 2A-2F" (page and figures untilted)

Replace "Sheet 5 of 5, Figure 6" (figure tilted) with attached replacement "Sheet 5 of 5, Figure 6" (page and figure untilted)

In the Specifications

Column 2, line 40-41, replace "optimising" with --optimizing--

Column 3, line 32, replace "14380" with --14880--

Column 4, line 53, replace "6" with --8--

Column 6, line 64, replace "35" with --36--

Column 7, line 28, replace "site" with --size--

Column 7, line 51, replace "scream" with --stream--

Column 8, line 48, replace "roils" with --rolls--

Column 9, line 11, replace "1933" with --1993--

Column 9, line 36, replace "63" with --68--

Signed and Sealed this
Thirtieth Day of July, 2013

Teresa Stanek Rea
*Acting Director of the United States Patent and Trademark Office*